US006807064B2

(12) United States Patent
Hedler et al.

(10) Patent No.: US 6,807,064 B2
(45) Date of Patent: Oct. 19, 2004

(54) ELECTRONIC COMPONENT WITH AT LEAST ONE SEMICONDUCTOR CHIP AND METHOD FOR PRODUCING THE ELECTRONIC COMPONENT

(75) Inventors: Harry Hedler, Germering (DE); Thorsten Meyer, Dresden (DE)

(73) Assignee: Infineon Technologies AG, Munich (DE)

( * ) Notice: Subject to any disclaimer, the term of this patent is extended or adjusted under 35 U.S.C. 154(b) by 139 days.

(21) Appl. No.: 10/236,895

(22) Filed: Sep. 6, 2002

(65) Prior Publication Data

US 2003/0067062 A1 Apr. 10, 2003

(30) Foreign Application Priority Data

Sep. 6, 2001 (DE) .......................................... 101 43 790

(51) Int. Cl.[7] .............................. H05K 7/10; H05K 7/12
(52) U.S. Cl. ........................ 361/767; 361/803; 438/613
(58) Field of Search ................................. 361/767–774, 361/803; 174/260–263; 257/723–724, 777–780; 438/612–613, 118, 125, 106; 29/840–846

(56) References Cited

U.S. PATENT DOCUMENTS

| 5,111,279 | A | * | 5/1992 | Pasch et al. ................. 257/778 |
| 5,384,952 | A | * | 1/1995 | Matsui .......................... 29/840 |
| 5,477,160 | A | * | 12/1995 | Love ........................... 324/755 |
| 5,700,715 | A |   | 12/1997 | Pasch |
| 5,783,465 | A |   | 7/1998 | Canning et al. |
| 5,874,782 | A | * | 2/1999 | Palagonia .................... 257/778 |
| 5,920,125 | A | * | 7/1999 | Ellerson et al. ............. 257/778 |
| 5,985,682 | A |   | 11/1999 | Higgins, III |
| 6,084,781 | A | * | 7/2000 | Klein .......................... 361/771 |
| 6,277,669 | B1 | * | 8/2001 | Kung et al. ................. 438/106 |
| 6,281,452 | B1 | * | 8/2001 | Prasad et al. ............... 174/262 |
| 6,284,563 | B1 | * | 9/2001 | Fjelstad ...................... 438/106 |
| 2002/0034872 | A1 | * | 3/2002 | Kazama et al. ............. 438/613 |

FOREIGN PATENT DOCUMENTS

DE          100 45 043 A1     4/2001

OTHER PUBLICATIONS

Nishimori, T. et al.: Characteristics and Potential Application of Polyimide–Core–Bump to Flip Chip, IEEE, vol. 19, No. 1, Mar. 1996, pp. 18–23.

* cited by examiner

Primary Examiner—Kamand Cuneo
Assistant Examiner—Tuan Dinh
(74) Attorney, Agent, or Firm—Laurence A. Greenberg; Werner H. Stemer; Gregory L. Mayback

(57) ABSTRACT

An electronic component having at least one semiconductor chip, a rewiring layer connected to the semiconductor chip, and a printed circuit board associated with the rewiring layer. The rewiring layer is provided with flexible contacts that correspond with contact faces of the printed circuit board, and the rewiring layer is solidly connected to the printed circuit board via a flat intermediate layer. A method for producing the electronic component is described.

24 Claims, 3 Drawing Sheets

ELECTRONIC COMPONENT WITH AT LEAST ONE SEMICONDUCTOR CHIP AND METHOD FOR PRODUCING THE ELECTRONIC COMPONENT

BACKGROUND OF THE INVENTION

FIELD OF THE INVENTION

The invention relates to an electronic component with at least one semiconductor chip, and to a method for producing the electronic component.

Electronic semiconductor chips can be connected to rewiring boards or layers and printed circuit boards to make so-called chip size packages (CSPs). The electrical and mechanical connections between the individual components can contain soldered wire connections. The soldered connections, which by now are made with lead-free solder, must be heated to temperatures of at least 240° C. This puts a considerable temperature stress on the vulnerable semiconductor components. Once the CSPs have been produced, test routines are performed for functionally testing the semiconductor chips; if the outcome is negative, the already-soldered semiconductor chips have to be replaced. Besides the effort of handling, which involves labor costs and slows down production, this also results in another high temperature stress on the components.

SUMMARY OF THE INVENTION

It is accordingly an object of the invention to provide an electronic component with at least one semiconductor chip and a method for producing the electronic component which overcomes the above-mentioned disadvantages of the prior art devices and methods of this general type, which furnishes a fast component connection, which can be produced economically, between a semiconductor chip, a rewiring layer and a printed circuit board that moreover enables fast replacement of an already-mounted semiconductor chip.

With the foregoing and other objects in view there is provided, in accordance with the invention, an electronic component. The electronic component contains at least one semiconductor chip, a rewiring layer connected to the semiconductor chip and has a surface remote from the semiconductor chip, a printed circuit board associated with the rewiring layer, and contact faces disposed on the printed circuit board. Flexible contacts are disposed on the surface of the rewiring layer remote from the semiconductor chip. The flexible contacts correspond with the contact faces on the printed circuit board. A flat intermediate layer solidly connects the rewiring layer to the printed circuit board.

According to the invention, the electronic component has the semiconductor chip, the rewiring layer connected to the semiconductor chip, and the printed circuit board associated with the rewiring layer. It is provided that the rewiring layer has flexible contacts, which correspond to contact faces of the printed circuit board, and that the rewiring layer is solidly connected to the printed circuit board via a flat intermediate layer.

The electronic component of the invention has the advantage that a separable component connection between the rewiring layer, with the at least one semiconductor chip mounted on it, and the printed circuit board can be produced quickly and inexpensively. Moreover, the mounting can be done with a very high throughput, without having to make soldered connections that would represent a considerable temperature stress and an unavoidable expenditure of time in processing the components. A single semiconductor chip can be mounted on the rewiring layer. However, electronic components with many semiconductor chips on a single rewiring layer are also possible. It is also possible for one or more rewiring layers to be mounted on one printed circuit board, so that optionally, very large scale integration electronic components can be achieved.

In a first embodiment of the invention, the rewiring layer, having the at least one semiconductor chip, and the printed circuit board are mounted at a defined spacing from one another. This has the advantage that the flexible contacts of the rewiring layer are placed with a defined contact to the contact faces of the printed circuit board and assure a secure electrical contact of the two components. Depending on the size of the flexible contacts, the defined spacing can advantageously be in a range from about 50 μm to 200 μm, making extremely compact structural heights of the chip size packages (CSPs) feasible.

In a further embodiment of the invention, when the rewiring layer has been mounted on the printed circuit board, the flexible contacts are prestressed. This has the advantage of a defined contact force of the flexible contacts, thus assuring a secure electrical contact between the touching faces, which are metal. The elasticity, perpendicular to the component surface, of the flexible contacts moreover assures a certain composition for unevenness and raised areas of the rewiring layer or of the printed circuit board relative to one another.

One embodiment of the invention provides that the flexible contacts protrude slightly past the flat intermediate layer between the rewiring layer and the printed circuit board, in the unstressed state. The embodiment has the advantage of a reliable connection at all times between the flexible contacts and the contact faces of the printed circuit board, since the flexible contacts are initially elastically deformed, until they mechanically impact the flat intermediate layer and thus form a reliable electrical contact.

In another embodiment of the invention, the flat intermediate layer contains a plastic, which has the advantage of simple, economical processability—for example by injection molding. Moreover, plastic acts as an electrical and thermal insulator, so that it is advantageously suitable as a touch layer, even of current-carrying regions of the semiconductor chip or of the rewiring layer.

In a further embodiment of the invention, the flat intermediate layer is embodied in multiple parts, and only at interstices between adjacent flexible contacts and/or groups of flexible contacts is it applied. This has the advantage that the flexible contacts have enough clearance for deformation at all times, without striking the intermediate layer in their elastic flexing.

One embodiment of the invention provides that the flat intermediate layer is perforated, and that flexible contacts are disposed in the interstices. This embodiment has the advantage of particular stability, because of the grid-net shaped structure formed as a result. This also makes it possible to simplify processability in a single, fast injection molding process.

In one embodiment of the invention, the flat intermediate layer is a film that is adhesive on both sides, which has the advantage of especially simple, extremely fast processability. The film can be applied in one step, immediately after which the rewiring layer can be pressed onto the printed circuit board. This makes for very fast cycle times and thus a very high throughput in production of the electronic components of the invention.

In a further embodiment of the invention, the flat intermediate layer is embodied as a one-piece perforated or multi-part base on the rewiring layer, over which a thin adhesive film is secured. This base can be applied in a simple way, for instance using a pressing technique, and has a defined thickness. The thin adhesive film applied over it then assures a solid bond between the base, which is already solidly connected to the rewiring layer, and the printed circuit board. The base can advantageously contain a polymer material, for instance, which makes it especially simple to process. As needed, the base can be in multiple parts, with the parts each disposed in interstices between flexible contacts. A one-piece version in a grid-net shaped structure is equally possible.

An alternative embodiment of the invention provides that the flat intermediate layer is embodied as a one-piece perforated or multi-part base on the printed circuit board, over which a thin adhesive film is secured. This has the advantage that compared with the above embodiment, a defective semiconductor chip can be easily removed from the printed circuit board again and replaced with an intact one.

One embodiment of the invention provides that the adhesive bond adheres more strongly to the printed circuit board than to the rewiring layer, which has the advantage of a defined parting point when a defective semiconductor chip is being removed. This prevents the adhesive film from detaching from the base before the rewiring layer is separated from the film.

In a further embodiment of the invention, the adhesive bond is embodied detachably on the rewiring layer, which in particular has the advantage of fast, simple removability of a semiconductor chip that has been tested and found defective.

In a further embodiment of the invention, the adhesive bond on the rewiring layer can be reused repeatedly, after a mounted rewiring layer has been detached, which has the special advantage that a tested semiconductor chip found to be defective can easily be replaced with an intact one. No further application steps whatever, such as applying a new adhesive point or the like, are required for this.

An embodiment of the invention provides that the flexible contacts are embodied in the form of a contact hump. This has the advantage of uniform elastic deformation when the rewiring layers are applied to the printed circuit boards. A curved contour then assures a uniform distribution of the spring force over the entire course of the contact hump.

An embodiment of the invention provides that the flexible contacts are in touch contact with the respective corresponding contact faces of the printed circuit board. This embodiment has the advantage of a simple, very quickly made electrical connection between the semiconductor chip, the rewiring layer and the printed circuit board, without requiring more-extensive processing steps—such as soldering or the like. Moreover, in such a case, a defective semiconductor chip can especially easily be replaced with a new component, without first having to undo the electrical connection points.

An alternative embodiment of the invention provides that the flexible contacts are soldered and/or glued to the respectively corresponding contact faces of the printed circuit board. This alternative embodiment has the advantage of an especially stable, strong mechanical and electrical connection between the contact points.

In a method of the invention for producing an electronic component with at least one semiconductor chip, a rewiring layer connected to the at least one semiconductor chip, and a printed circuit board associated with the rewiring layer, it is provided that the rewiring layer is provided with flexible contacts, which correspond with contact faces of the printed circuit boards. It is also provided that the rewiring layer is solidly connected to the printed circuit board via a flat intermediate layer. According to the invention, the method is characterized by the now described method steps. After a semiconductor wafer has been produced, with semiconductor chips disposed in rows and columns, with saw-scoring regions provided between them, the chips are each connected to the rewiring layers. On the surface of the rewiring layer remote from the active side of the semiconductor chip, flexible contacts are applied. After that, flat intermediate layers are applied to the rewiring layers, after which the rewiring layers are glued to printed circuit boards. It is selectively possible either for only one, or for a plurality of, semiconductor chips to be applied to one rewiring layer. It is equally possible selectively for only one or for a plurality of rewiring layers to be applied to one printed circuit board.

This production method of the invention has the particular advantage that so-called CSPs can be produced quickly and inexpensively, and moreover, soldering which is a burden to the components can be dispensed with. The adhesive bonding of the rewiring layers to the printed circuit boards assures a solid, stable mechanical connection, while conversely the electrical connection is made by resilient contacts, which are entirely relieved of any mechanical carrier function. The flexible contacts instead slide along contact faces of the printed circuit board and are pressed slightly against them, until the rewiring layer comes to rest on the intermediate layer. Thus integrated electronic components, which are distinguished by a large scale of integration and high mechanical stability, can be produced in extremely short cycle times.

In a first exemplary embodiment of the method of the invention, the semiconductor wafer is cut apart into semiconductor chips, after the flexible contacts have been applied and before the rewiring layers are applied. This has the advantage that flexible production of different electronic components on the same production line is made possible. When the semiconductor chips are cut apart first and only after that are connected to rewiring layers, then optionally different components can be grouped on the same line and joined together.

In an alternative exemplary embodiment of the method, the semiconductor wafers are cut apart into electronic components after the rewiring layers have been mounted on the semiconductor chips. This has the advantage of especially fast processing in relatively large batches. If the rewiring layers are already connected to the semiconductor wafer, many electronic components can be produced in one operation that are only separated into individual components in a subsequent processing step. The rewiring layers can then selectively be sawn apart along with the wafer, or they can already be joined as individual parts to the semiconductor chips that are to be cut apart.

One embodiment of the method of the invention provides that a film that is adhesive on both sides is applied as a flat intermediate layer between the rewiring layer and the printed circuit board, which has the advantage of a very easily manipulated, stable component connection between the rewiring layer and the printed circuit board.

Another embodiment of the method of the invention is characterized in that as the flat intermediate layer, a base is applied to the rewiring layer or to the printed circuit board, and over it a thin adhesive film is applied. This embodiment has the advantage that the stable base can be embodied with very exact dimensional fidelity in a simple way, while conversely, a commercially available film can be used as the thin adhesive film. As the base, a thermoplastic, for instance, or the like can be considered, which can be processed by injection molding.

In an embodiment of the method of the invention, the adhesive bond adheres more strongly to the printed circuit board than to the rewiring layer, which has the advantage that a semiconductor chip tested and found defective can be detached again from the printed circuit board in a simple way, without the risk of separation of the adhesive film.

Finally, one embodiment of the method of the invention provides for adhesive bonding and/or soldering of the flexible contacts to the corresponding contact faces of the printed circuit board. This has the advantage of an even more-stable mechanical connection between the printed circuit board and the rewiring layer. Furthermore, it can be assured even more certainly in this way that all the flexible contacts will carry the electric current, and that a defective connection will not be made, for instance because of a poor contact.

A final exemplary embodiment of the invention provides that the semiconductor chips are tested after the rewiring layer is mounted on the printed circuit board, and that after a defective semiconductor chip is found, the adhesive bond can be undone and reused. This exemplary embodiment has the special advantage of fast, uncomplicated replaceability of defective parts. This replacement can be done in very short cycles; moreover, a new semiconductor chip can be placed without difficulty over the previously released adhesive point, without requiring any further processing steps of any kind.

In summary, the following aspects of the present invention are obtained. The basic concept is the configuration of a so-called chip size package (CSP) with so-called interconnect elements that are elastic in the vertical direction, and in the attachment of such a chip on a board or printed circuit board of a commercially available kind, at a suitable prestressing of the elastic interconnect elements, thus creating resilient electrical contacts between the rewiring layer, with the semiconductor chip mounted on it, and the printed circuit board. Technically, this can be realized for instance as follows. A chip is positioned by a chip bonder directly from the wafer onto the board and pressed against so strongly that a glue or adhesive layer located between the chip and the board brings about the adhesion of the chips on the board. Because the thickness of the adhesive layer is less than the height of the unstressed elastic interconnect elements, the chip bonder presses the elastic contacts down hard enough during the positioning that the mechanical stop is reached through the adhesive layer. The elastic interconnect elements prestressed in this way form a reliable electrical contact between the chip and the board or the rewiring layer.

The cycle time for producing the connections is very short and can amount to less than one second. If moreover the adhesive force is dimensioned such that the semiconductor chip can be detached from the board again at a defined perpendicular tensile stress, then easy replacement of a defective chip on the board is possible. At the same position, a new semiconductor chip can easily be mounted. If the electrical connection of the pressure contacts does not meet the desired requirements, then by an ensuing thermal process, such as soldering, adhesive bonding, or the creation of intermetallic phases, a further mechanical reinforcement of the connection and/or improvement of the electrical contact properties can be attained. However, this requires preparation of the contact elements prior to mounting.

The adhering intermediate layer for connecting the semiconductor chip and the board can, in a first variant, be embodied as an adhesive film that is adhesive on both sides and that in its thickness is slightly less than height of the unstressed elastic interconnect elements. The adhesive force on the board side is expediently markedly greater than on the chip side, so that the semiconductor chip can be easily removed from the board again if needed, and a new chip can be put in place. The adhesive film can be embodied in multiple parts or perforated, in which case the interconnect elements are disposed in the gaps.

In another variant, a one-piece pierced or multi-part base can additionally be applied to the wafer having the already-applied elastic interconnect elements; for instance, the base can be applied using the cost-saving pressing technique. The base layer is in turn slightly lower than the elastic contacts and thus forms a vertical stop when the board is put in place. The application of a very thin adhesive layer can be done either on the board or on the wafer. If it is applied to the wafer, then in a further function, including test runs and so-called burning-in, it can serve as an adhesive/adhering connection, which makes it unnecessary to use conventional bases with mechanical snap closures.

Other features which are considered as characteristic for the invention are set forth in the appended claims.

Although the invention is illustrated and described herein as embodied in an electronic component with at least one semiconductor chip and a method for producing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
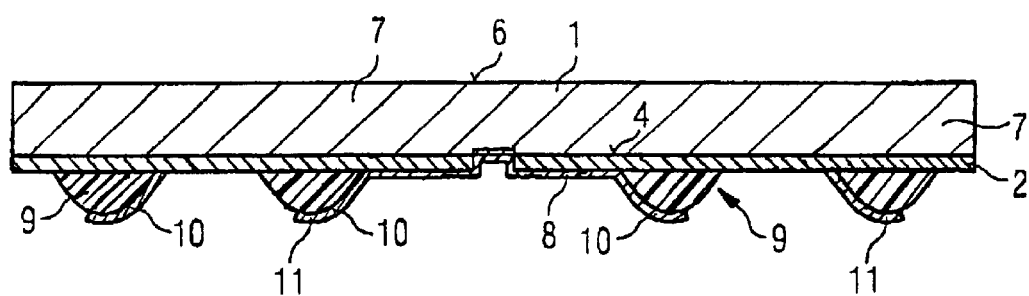
FIGS. 1–5 are diagrammatic, cross-sectional views of a first variant of process steps for putting together a semiconductor chip with a rewiring layer on a printed circuit board according to the invention.

Referring now to the figures of the drawing in detail and first, particularly, to FIG. 1 thereof, there is shown, in five successive diagrammatic cross-sectional views, a first variant of process steps for putting together a semiconductor chip 1 with a rewiring layer 2 and a printed circuit board 18. As seen in FIG. 1, the semiconductor chip 1 has an active front side 4 with semiconductor structures applied to it, and a passive backside 6 without semiconductor structures. By the active front side 4, the semiconductor chip 1 is connected to the rewiring layer 2, on which a number of conductor tracks 8 are applied, each of which ends in a respective curved or humplike flexible contact 10. Each of the flexible contacts 10 contains a flat conductor track segment, which yields elastically to vertical pressure. A curved portion 11 that is parallel in some segments to the surface of the rewiring layer 2 is rounded in such a way that the resilient contact 10, upon being placed on a contact face 20 (FIG. 3), can slide easily along the contact face 20. On its inner curved portion oriented toward the active front side 4, each resilient contact 10 can be provided with an elastic supporting or intermediate layer 9, which can prevent the contacts 10 from warping if they are touched or the like by mistake. Moreover, the elastic intermediate layer 9 acts as a progressive spring if the contacts 10 are indented more severely, to which they present an increasing resistance. On the passive back side 6 of the semiconductor chip 1, remote from the rewiring layer 2, both the semiconductor chip 1 and the rewiring layer 2 are covered by a housing 7, which can for instance be injection-molded plastic, a ceramic material, or the like.

Figure 2:
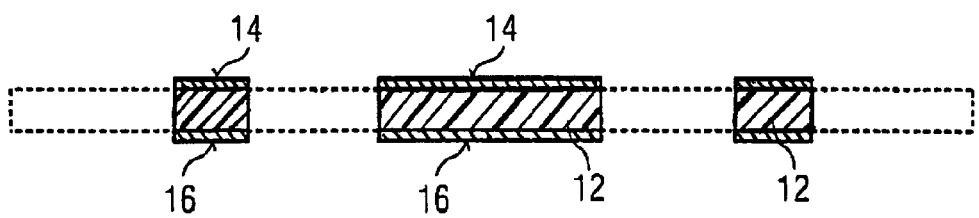

In FIG. 2, an intermediate layer 12 is shown which has a plurality of recesses. The flexible contacts 10 are located in the recesses, when the intermediate layer 12 has been applied to the rewiring layer 2. The intermediate layer 12, in the exemplary embodiment shown, thus has a grid-net shaped structure. On the side toward the semiconductor chip 1 and the rewiring layer 2, the intermediate layer 12 is covered by a first adhesive layer 14, which assures solid adhesion to the rewiring layer 2. On its opposite surface, the intermediate layer 12 is covered with a second adhesive layer 16, which again assures firm adhesion to the printed circuit board 18 shown in FIG. 3.

Figure 3:
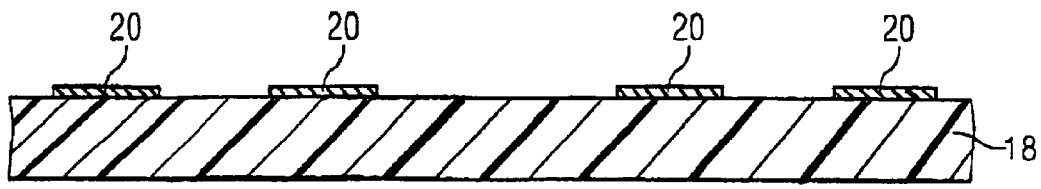

FIG. 3 shows the printed circuit board 18, which is provided with the contact faces 20 that correspond to the curved portions 11 of the flexible contacts 10 and that, when the rewiring layer 2 is put in place, establish an electrical contact with the rewiring layer and thus with the semiconductor chip 1.

Figure 4:
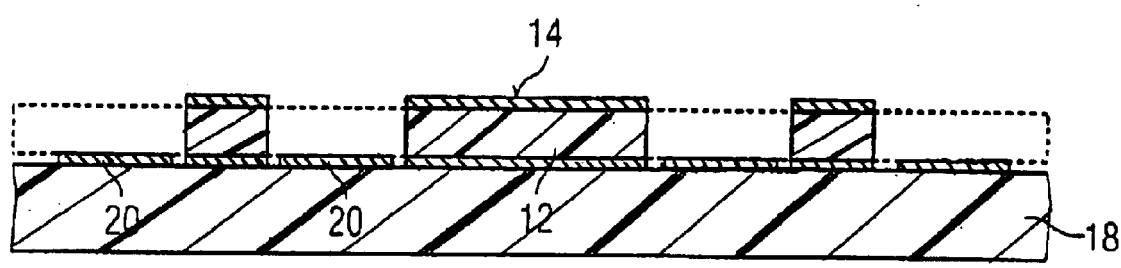

In FIG. 4, the intermediate layer 12 is glued by the second adhesive layer 16 to the printed circuit board 18. The recesses in the intermediate layer 12 leave the contact faces 20 free, so that the flexible contacts 10 can be subsequently inserted into the interstices.

Figure 5:
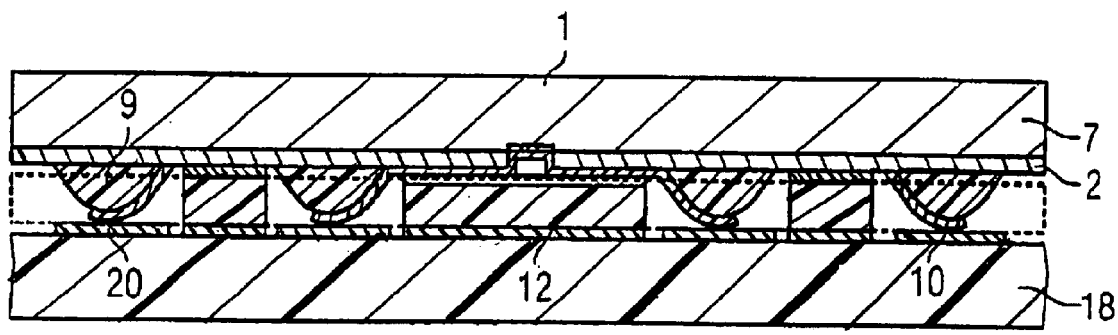

FIG. 5 shows the assembled component containing the semiconductor chip 1, the rewiring layer 2, the intermediate layer 12, and the printed circuit board 18. It can be advantageous if the second adhesive layer 16 adheres more strongly than the first adhesive layer 14, since then the rewiring layer 2 with the semiconductor chip 1 can be removed again without difficulty from the intermediate layer 12 in a perpendicular direction, for instance if a defect in the semiconductor chip 1 has been found. Since the adhesive layer 14 can be used multiple times, in this case a new semiconductor chip 1 can be placed with the rewiring layer 2 on the intermediate layer 12, whereupon its flexible contacts 10 again take their seat on the contact faces 20 and assure an electrical connection between the printed circuit board 18 and the semiconductor chip 1 with the rewiring layer 2.

FIGS. 6–9, in four successive diagrammatic cross-sectional views, show an alternative variant of the process steps in joining the semiconductor chip 1 to the rewiring layer 2 and to the printed circuit board 18.

Figure 6:
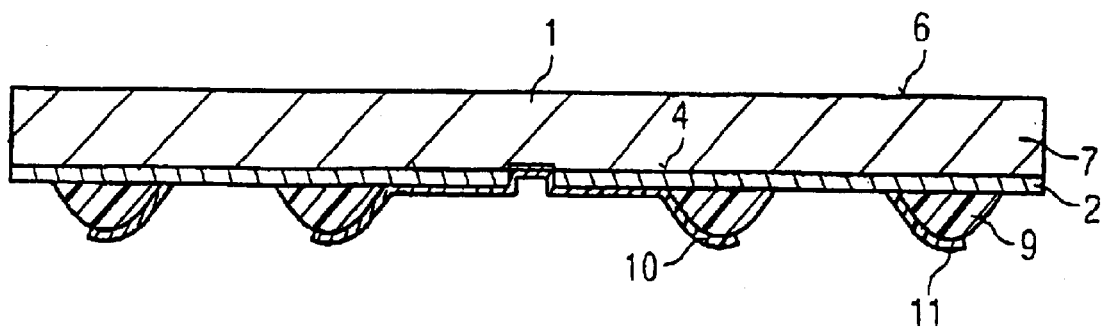
FIGS. 6–9 are diagrammatic, cross-sectional views showing a second variant of the process steps upon joining of the semiconductor chip to the rewiring layer and the printed circuit board.

FIG. 6 is essentially equivalent to FIG. 1, already described above.

Figure 7:
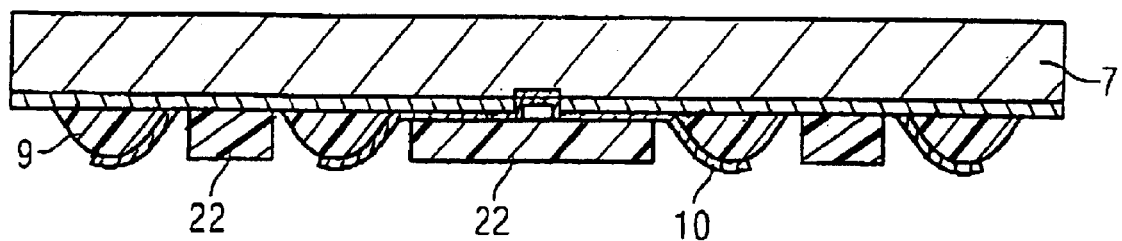

FIG. 7, unlike the above-described variant, shows a base 22 that is solidly joined to the rewiring layer 2, which is formed of plastic, for instance.

Figure 8:
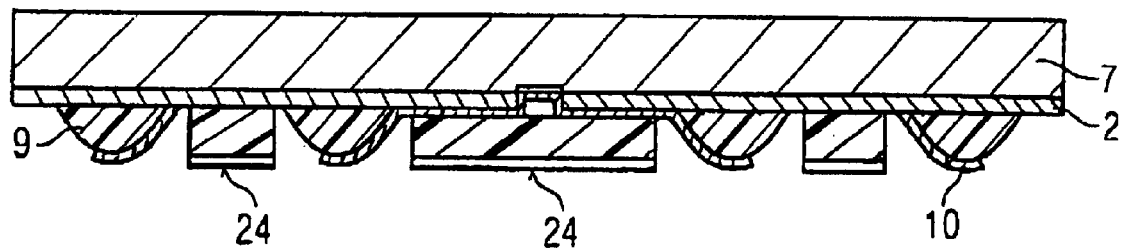

FIG. 8 illustrates the fact that the unstressed flexible contacts 10 protrude slightly, with their curved portions 11, past the outer boundary of the base 22 and of a third adhesive layer 24 applied over it.

Figure 9:
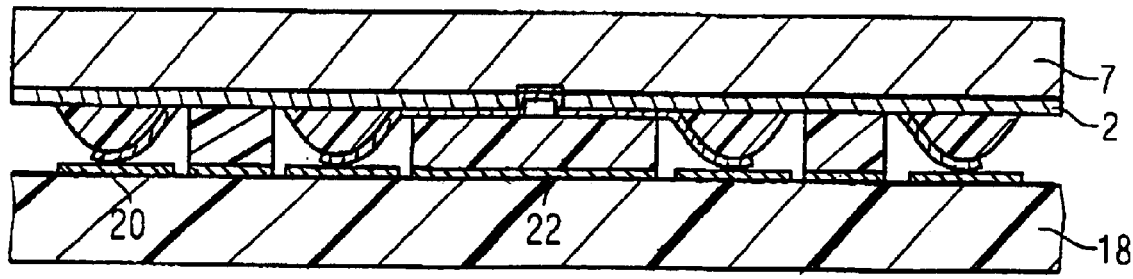

FIG. 9 shows the flexible contacts 10 seated on the printed circuit board 18. The flexible contacts 10 are elastically deformed in the process, until the base 22 rests with the third adhesive layer 24 fully on the printed circuit board 18 and forms a mechanical stop.

In conjunction with FIGS. 1–9, the method of the invention for producing the electronic component described above will now be described. After a semiconductor wafer, with semiconductor chips 1 disposed in rows and columns and with saw-scoring regions provided between them, the rewiring layers 2 are mounted on the active sides 4 of the semiconductor chip 1. The rewiring layers 2 can be provided, on their surfaces remote from the semiconductor chip 1, with the flexible contacts 10. After that, the flat intermediate layers 12 or the bases 22 are applied to the undersides of each of the rewiring layers 2, after which adhesive bonding of the rewiring layer 2 to printed circuit boards 18 is done. It is selectively possible for only one, or for a plurality of, the semiconductor chips 1 to be applied to one rewiring layer 2. Equally, it is possible for only one or for a plurality of the rewiring layers 2 to be connected to one printed circuit board 18.

Cutting the semiconductor wafers apart into individual semiconductor chips 1 can be done either after the printed circuit boards 18 have been applied or already before that. In the latter case, the semiconductor chips 1 that have been cut apart are connected to the printed circuit boards 18 as described above.

The production of the rewiring layers 2 can be advantageously effected by applying a thin dielectric (for instance approximately 5 $\mu$m) to a semiconductor wafer, onto which a metal layer is applied or deposited. The metal layer for instance has copper or aluminum, and for example it can be applied by sputtering or by thin-film technology. After a photoresist has been applied and the photosensitive layer has been exposed to light and developed, the conductor tracks 8 are laid bare by etching. By structuring ends of conductor tracks on the humps of the elastic intermediate layer 9, the flexible contacts 10 are made. The elastic intermediate layer 9 can for instance contain silicone.

We claim:

1. An electronic component, comprising:
   at least one semiconductor chip;
   a rewiring layer connected to said semiconductor chip and having a surface remote from said semiconductor chip;
   a printed circuit board associated with said rewiring layer;
   contact faces disposed on said printed circuit board;
   flexible contacts disposed on said surface of said rewiring layer remote from said semiconductor chip, said flexible contacts corresponding with said contact faces on said printed circuit board; and
   a flat intermediate layer solidly connecting said rewiring layer to said printed circuit board;
   said flexible contacts formed on said rewiring layer being subject to pre-stressing, said flexible contacts protruding slightly past flat intermediate layer between said rewiring layer and said printed circuit board when in an unstressed state.

2. The electronic component according to claim 1, wherein said rewiring layer, said semiconductor chip, and said printed circuit board are mounted at a defined spacing from one another.

3. The electronic component according to claim 1, wherein said flat intermediate layer is formed of plastic.

4. The electronic component according to claim 1, wherein said flat intermediate layer is embodied in multiple parts and is applied only in interstices between adjacent ones of said flexible contacts.

5. The electronic component according to claim 1, wherein said flat intermediate layer has perforations formed therein, and said flexible contacts are disposed in said perforations.

6. The electronic component according to claim 1, wherein said flat intermediate layer is a film having two sides and an adhesive disposed on each of said two sides for forming an adhesive bond on each of said sides with said printed circuit board and said rewiring layer, respectively.

7. The electronic component according to claim 1,
wherein said flat intermediate is a one-piece part having perforation formed therein and disposed on said rewiring layer; and
further comprising a thin adhesive film secured to said flat intermediate layer.

8. The electronic component according to claim 1,
wherein said flat intermediate layer is a one-piece part having perforations formed therein and disposed on said printed circuit board; and
further comprising a thin adhesive film secured to said one-piece part.

9. The electronic component according to claim 1, wherein said flexible contacts are contact humps.

10. The electronic component according to claim 1, wherein each of said flexible contacts is in touch contact with a respective corresponding one of said contact faces on said printed circuit board.

11. The electronic component according to claim 1, wherein each of said flexible contacts is at least one of soldered and glued to a respectively corresponding one of said contact faces on said printed circuit board.

12. The electronic component according to claim 1, wherein said flat intermediate layer is embodied in multiple parts and is applied only in interstices between groups of said flexible contacts.

13. The electronic component according to claim 1,
wherein said flat intermediate layer is a multi-part base disposed on said rewiring layer; and
further comprising a thin adhesive film secured over said multi-part base.

14. The electronic component according to claim 1,
wherein said flat intermediate layer is a multi-part base disposed on said printed circuit board; and
further comprising a thin adhesive film secured to said multi-part base.

15. The electronic component according to claim 6, wherein said adhesive bond adheres more strongly to said printed circuit board than to said rewiring layer.

16. The electronic component according to claim 6, wherein said adhesive bond is embodied detachably on said rewiring layer.

17. The electronic component according to claim 6, wherein said adhesive bond with said rewiring layer can be reused repeatedly, after a mounted rewiring layer has been detached.

18. A method for producing electronic components, which comprises the steps of:
furnishing a semiconductor wafer having semiconductor chips disposed in rows and columns and saw-scoring regions provided between said semiconductor chips;
applying rewiring layers, one each, to active front sides of each of the semiconductor chips;
applying flexible contacts to surfaces of the rewiring layers remote from the active front sides of the semiconductor chips;
applying a flat intermediate layer to sides of the rewiring layers remote from the semiconductor chips; and
bonding the rewiring layers to printed circuit boards having contact faces aligned with the flexible contacts; said flexible contacts formed on said rewiring layer being subject to pre-stressing, said flexible contacts protruding slightly past said intermediate layer between said rewiring layer and said printed circuit board when in an unstressed state.

19. The method according to claim 18, which comprises separating the semiconductor wafer into individual semiconductor chips after the rewiring layers have been applied.

20. The method according to claim 18, which comprises using a film being adhesive on both sides as the flat intermediate layer and applying the film between each of the rewiring layers and the printed circuit boards resulting in adhesive bonds.

21. The method according to claim 18, which comprises:
using a base as the flat intermediate layer;
applying a thin adhesive film to the base; and
applying the base to one of the rewiring layers and to the printed circuit boards.

22. The method according to claim 18, which comprises embodying each of the flexible contacts as a contact hump.

23. The method according to claim 18, which comprises:
testing each of the semiconductor chips with the rewiring layers after being mounted on the printed circuit boards; and
detaching an adhesive bond for removing a defective semiconductor chip, the adhesive bond is detachable and reusable.

24. The method according claim 20, which comprises wherein the adhesive bonds adhere more strongly to the printed circuit boards than to the rewiring layers.

* * * * *